US008076762B2

(12) United States Patent
Chandrasekaran et al.

(10) Patent No.: US 8,076,762 B2
(45) Date of Patent: Dec. 13, 2011

(54) VARIABLE FEATURE INTERFACE THAT INDUCES A BALANCED STRESS TO PREVENT THIN DIE WARPAGE

(75) Inventors: Arvind Chandrasekaran, San Diego, CA (US); Ratibor Radojcic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 186 days.

(21) Appl. No.: 12/540,586

(22) Filed: Aug. 13, 2009

(65) Prior Publication Data

US 2011/0037156 A1 Feb. 17, 2011

(51) Int. Cl.
*H01L 23/52* (2006.01)
(52) U.S. Cl. . 257/673; 257/780; 257/782; 257/E21.511; 438/612; 438/613
(58) Field of Classification Search ................ None
See application file for complete search history.

(56) References Cited

U.S. PATENT DOCUMENTS

| 5,435,482 | A | | 7/1995 | Variot et al. |
| 6,109,507 | A | * | 8/2000 | Yagi et al. .................... 427/97.2 |
| 6,396,159 | B1 | | 5/2002 | Shoji |
| 6,527,159 | B2 | | 3/2003 | Matthies et al. |
| 2003/0010807 | A1 | * | 1/2003 | Matthies et al. .............. 228/103 |

FOREIGN PATENT DOCUMENTS

| JP | 9246324 A | 9/1997 |
| WO | 9840912 A1 | 9/1998 |

OTHER PUBLICATIONS

International Search Report and Written Opinion—PCT/US2010/045499, International Search Authority— European Patent Office—Feb. 24, 2011.
Partial International Search Report—PCT/US2010/045499—International Search Authority, European Patent Office, Dec. 8, 2010.
Scheifers S M et al: "A Novel Method of Minimizing Printed Wire Board Warpage", Motorola Technical Developments, Motorola Inc., Schaumburg, Illinois, US, vol. 28, Aug. 1, 1996, pp. 50-55, XP000638420, ISSN: 0887-5286.
Tu K N. et al: "Physics and materials challenges for lead-free solders", Journal of Applied Physics, American Institute of Physics. New York, US, vol. 93, No. 3, Feb. 1, 2003, pp. 1335-1353, XP012058916, ISSN: 0021-8979, DOI: 10.1063/1.1517165 pp. 1349-1350, section "Thermal stress".
3, Feb. 1, 2003, pp. 1335-1353, XP012058916, ISSN: 0021-8979, DOI: 10.1063/1.1517165 pp. 1349-1350, section "Thermal stress".

* cited by examiner

*Primary Examiner* — Evan Pert
*Assistant Examiner* — Scott R Wilson
(74) *Attorney, Agent, or Firm* — Michelle Gallardo; Nicholas J. Pauley; Jonathan T. Velasco (57) ABSTRACT

A packaged semiconductor product includes a packaging substrate coupled to a semiconductor die through an interconnect structure with elements of variable features. The interconnect structure may be bumps or pillars. The variable features of the interconnect structure induce a reverse bend on the semiconductor die that mitigates warpage of the semiconductor die during semiconductor assembly by balancing bending of the packaging substrate during reflow. The variable features can be variable height and/or variable composition.

20 Claims, 6 Drawing Sheets

(PRIOR ART)

FIG. 3

(PRIOR ART)

VARIABLE FEATURE INTERFACE THAT INDUCES A BALANCED STRESS TO PREVENT THIN DIE WARPAGE

TECHNICAL FIELD

The present disclosure generally relates to integrated circuits (ICs). More specifically, the present disclosure relates to manufacturing integrated circuits.

BACKGROUND

Semiconductor dies include collections of transistors and other components. Commonly, these substrates are semiconductor materials, and, in particular, silicon. Additionally, these substrates are conventionally thicker than necessary to obtain desirable device behavior. The semiconductor dies are singulated or diced from a semiconductor wafer.

Thick dies have advantages during semiconductor assembly. During assembly of semiconductor dies such as packaging, a semiconductor die endures dozens of processes, high temperatures, and transfers between tools or even fabrication sites. During these transfers the semiconductor die can break, resulting in a loss of time and resources. Thick dies are less likely to be damaged during manufacturing.

Despite the advantages of thick dies listed above, thin dies may be preferred for some assembly processes. One example of assembly of thin semiconductor dies is construction of stacked ICs. Stacked ICs increase device functionality and decrease die size by stacking dies vertically. Similar to high-rise towers that fit more office space in a smaller land area, stacked ICs offer more space for transistors and other components while occupying the same area.

In stacked ICs, a second die is stacked on a first die allowing construction to expand into three dimensions (3D). Stacked ICs allow products with a greater number of components to fit in small form factors. Component density of a semiconductor die is number of components in the die divided by the die area. Thus, stacking a die on an identical die results in approximately double component density. When a second die is stacked on a first die, the two dies share the same packaging and communicate to external devices through the packaging.

Conventionally, the second die is coupled to packaging and external devices with through silicon vias located in the first die. Through silicon vias are limited in aspect ratio based, in part, on the manufacturing technique selected. As a result, the height of the first die is limited in order to ensure the through silicon via may extend the entire height of the first die. The through silicon via should extend the entire height to create a conducting path from a packaging substrate to the second die. As the height of the first die decreases to accommodate the through silicon via manufacturing, the first die loses structural strength.

During assembly of the first die on a packaging substrate, the thin die may bend. The bending results from insufficient mechanical strength of the thin die to withstand heat cycles and thermal mechanical changes during the assembly process. Bending of the thin die may result in broken or undesirable function of components in the thin die. Additionally, physical bending may result in an undesirable semiconductor die geometry or size.

Thus, there is a need for reducing bending in a semiconductor die during semiconductor assembly.

BRIEF SUMMARY

According to one aspect of the disclosure, a semiconductor system includes a semiconductor die having an interconnect structure with elements of at least one variable feature. The variable features allows for opposite bending on the semiconductor die to mitigate warpage during semiconductor assembly. The semiconductor system also includes a first packaging substrate that communicates with the semiconductor die through the interconnect structure.

According to another aspect of the disclosure, a method of semiconductor assembly includes providing on a semiconductor die an interconnect structure having elements of a variable feature. The elements of variable feature allow a reverse bend on the semiconductor die during the semiconductor assembly. The reverse bend mitigates warpage during the semiconductor assembly. The method also includes coupling the semiconductor die to a packaging substrate through the interconnect structure.

According to a further aspect of the disclosure, a semiconductor system includes a packaging substrate. The semiconductor system also includes a semiconductor die coupled to the packaging substrate through means for communicating with the packaging substrate. The communicating means having elements of at least one variable feature. The variable feature allows a reverse bend on the semiconductor die to mitigate warpage of the semiconductor die during semiconductor assembly.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
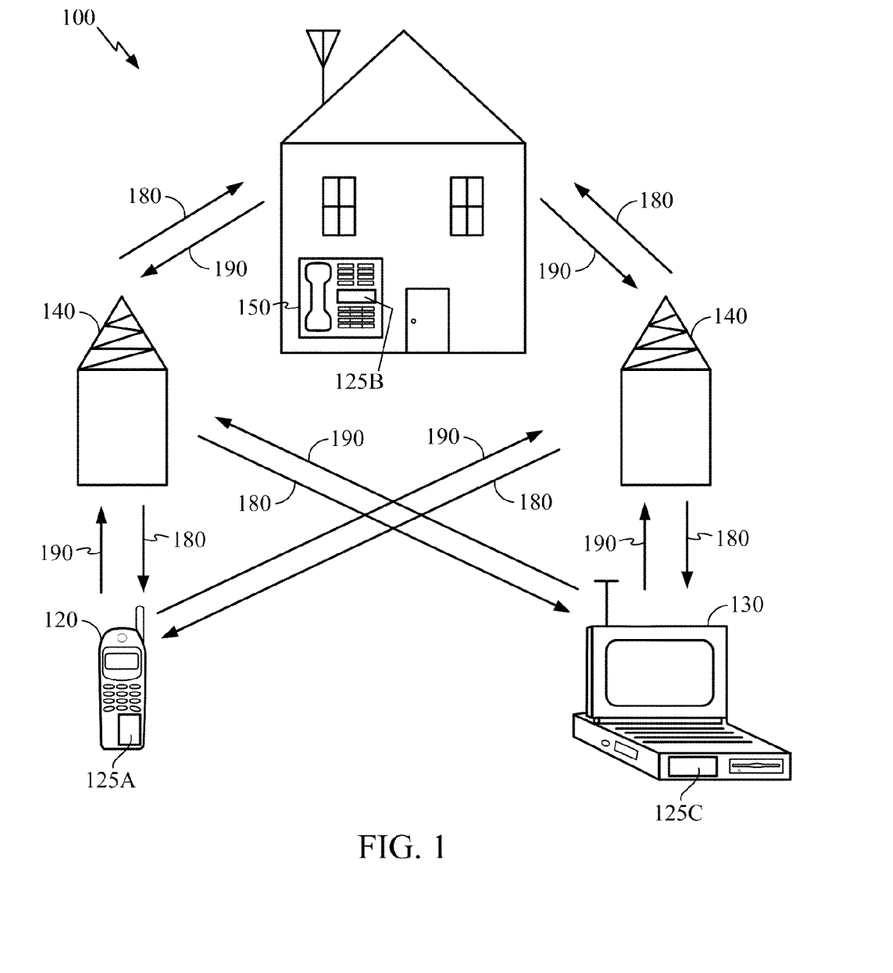
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include IC devices 125A, 125B and 125C, having circuitry manufactured by the processes disclosed here. It will be recognized that any device containing an IC may also include semiconductor components having the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. The disclosure may be suitably employed in any device which includes semiconductor components, as described below.

Figure 2:
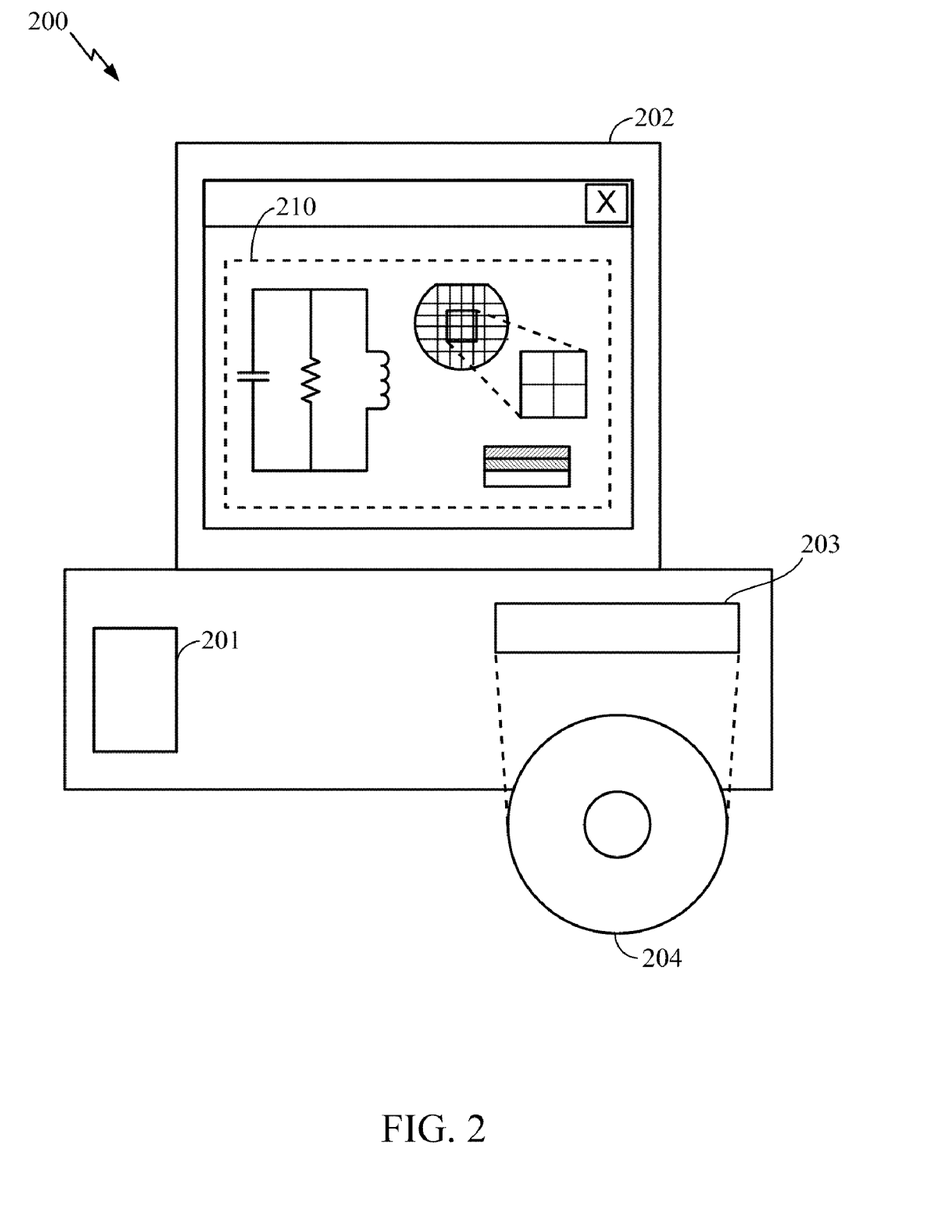
FIG. 2 is a block diagram illustrating a design workstation used for circuit, layout, and logic design of the disclosed semiconductor integrated circuit package.

FIG. 2 is a block diagram illustrating a design workstation used for circuit, layout, logic, wafer, die, and layer design of a semiconductor part as disclosed below. A design workstation 200 includes a hard disk 201 containing operating system software, support files, and design software such as Cadence or OrCAD. The design workstation 200 also includes a display to facilitate design of a semiconductor part 210 that may include a circuit, a semiconductor wafer, a semiconductor die, or layers contained within a semiconductor wafer or semiconductor die. A storage medium 204 is provided for tangibly storing the semiconductor part 210. The semiconductor part 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the semiconductor part 210 by decreasing the number of processes for designing circuits, semiconductor wafers, semiconductor dies, or layers contained within a semiconductor wafer or semiconductor die.

Figure 3:
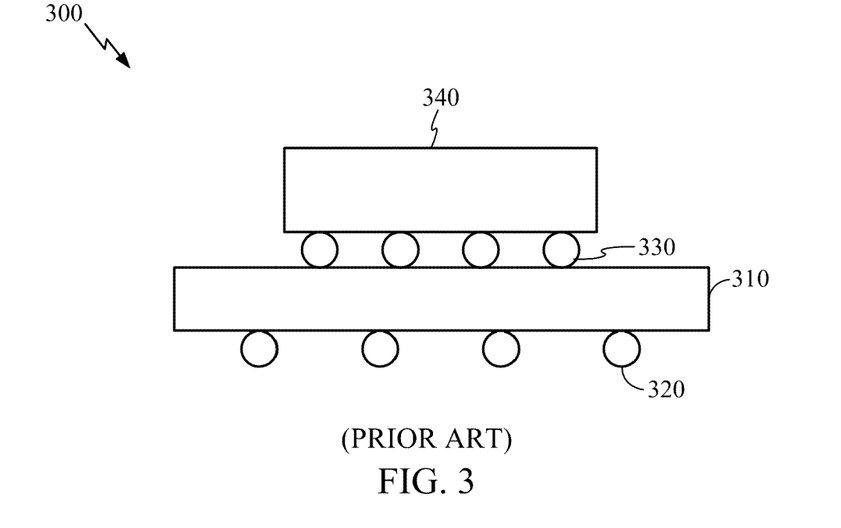
FIG. 3 is a block diagram illustrating a conventional packaged die.

FIG. 3 is a block diagram illustrating a conventional packaged die. A packaged die 300 includes a packaging substrate 310 having a packaging connection 320. The packaging connection 320 may be bumps or pillars, for example. The packaged die 300 also includes a die 340 coupled to the packaging substrate 310 through an interconnect structure 330. The interconnect structure 330 may be, for example, bumps or pillars.

The packaged die 300 has no induced bend resulting from packaging. Thus, the packaging substrate 310 and the die 340 have substantially level surfaces. Bending of the die 340 may occur for a number of reasons. In semiconductor manufacturing and subsequent semiconductor assembly of a die 340 in a packaged die 300, multiple layers are manufactured or bonded together using various manufacturing processes. When multiple layers are brought together and cycle through different temperatures, the difference in the layers' coefficient of thermal expansion causes each layer to expand and contract differently. Some of these expansions and contractions are elastic while others are inelastic, causing varying amounts of bending depending on the number of layers and type of layer. The packaged die 300 responds to all internal forces and moments by bending to reach a point of equilibrium. As a result, the shape of the die 340 changes in response to bending of the packaging substrate 310 as illustrated in FIG. 4.

Figure 4:
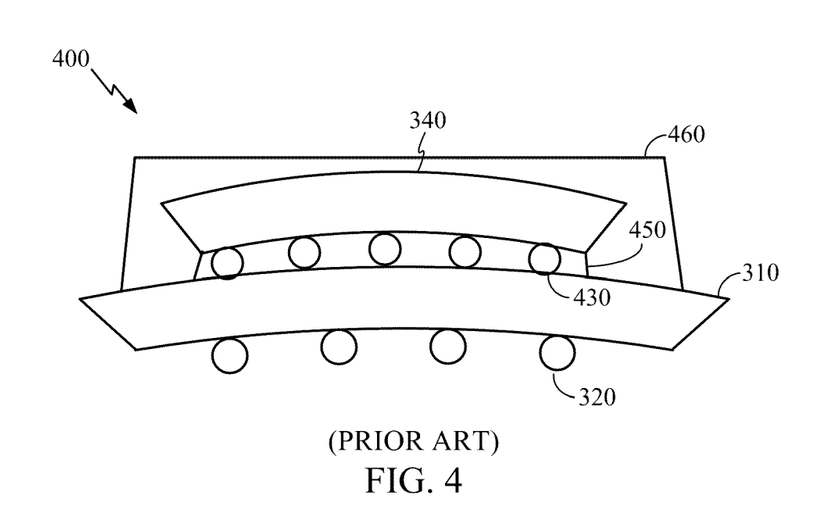
FIG. 4 is a block diagram illustrating a conventional packaged die after reflow.

FIG. 4 is a block diagram illustrating a conventional packaged die after reflow. After reflow an underfill 450 and a molding compound 460 may be deposited on the packaged die 400. Residual bending in a packaged die 400 may be a result of semiconductor assembly processes. For example, the packaging substrate 310 and the die 340 are elongated along their long axis according to a coefficient of thermal expansion when heating and cooling during ball/pillar reflow. Alternatively, the die 340 may bend upwardly or downwardly (convex or concave). Although the packaging substrate 310 as shown bends downwardly, the packaging substrate 310 may also bend upwardly.

In one example, during heating and cooling the die 340 expands and contracts about 3-4 parts per million (ppm) per degree Centigrade, and the packaging substrate 310 expands about 16 ppm per degree Centigrade. Because the packaging substrate 310 and the die 340 are coupled and expand and contract at different rates, residual bending occurs in the packaged die 400.

Bending of a die may be avoided by inducing reverse bending of the die. Reverse bending imparts a controlled initial bend on the die. The initial bend is cancelled by an approximately equal and reverse bend experienced by the die during subsequent thermal cycles. For example, an initial bend may be used to cancel bending during semiconductor assembly. According to one embodiment, the controlled initial bend is applied through interface height variation as described below in FIG. 5 and FIG. 6.

Figure 5:
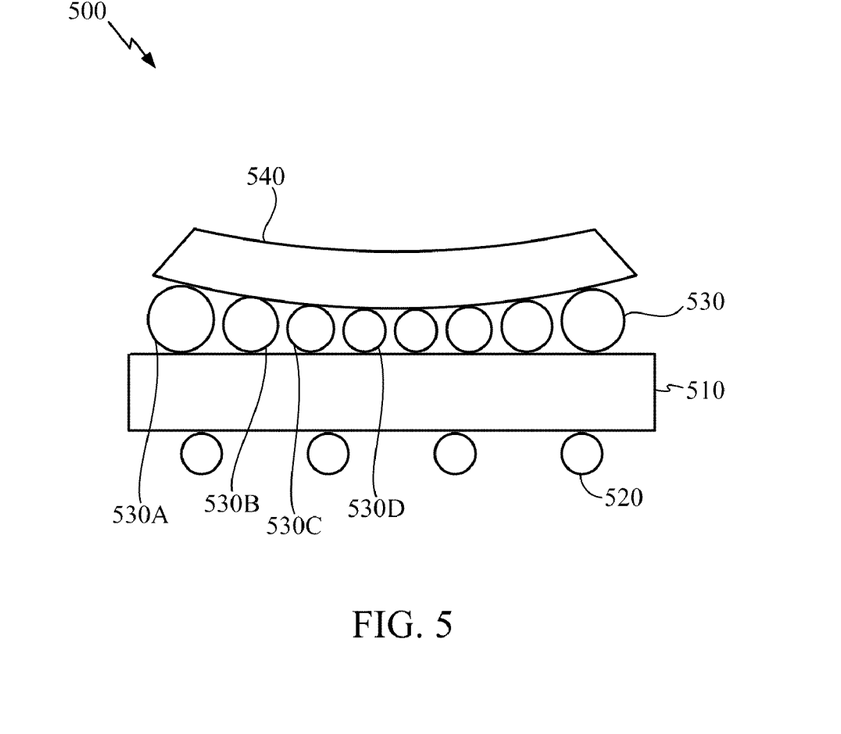
FIG. 5 is a block diagram illustrating an exemplary packaged die having induced reverse bending according to a first embodiment.

FIG. 5 is a block diagram illustrating an exemplary packaged die having induced reverse bending according to a first embodiment. A packaged die 500 includes a packaging substrate 510 having a packaging connection 520. Coupled to the packaging substrate 510 is a die 540. The die 540 is coupled to the packaging substrate 510 through an interconnect structure 530. The interconnect structure 530 may be, for example, bumps or pillars.

A reverse bending of the die 540 occurs during reflow of the interconnect structure 530 (and/or during compression of the die 540 towards the packaging substrate 510) by varying a height of the interconnect structure components (e.g., bumps or pillars). When the die 540 is compressed against the packaging substrate 510 the die 540 bends. Bending of the die 540 in one embodiment is designed to induce an inverse bend resulting from an inverse stress to counter bending imposed by a heating and cooling process such as reflow. A controlled inverse bend may be engineered to prevent damage to the die 540, whereas bending during manufacturing may be uncontrollable.

For example, if the interconnect structure 530 is bumps of a ball grid array, the height of each bump is varied. In this case, a bump 530A at the periphery of the die 540 is larger than a bump 530B closer to the center of the die 540. The size reduction continues for a bump 530C, which is closer to the center of the die 540 than the bump 530B; and for a bump 530D, which is closer to the center of the die 540 than the bump 530C. Although only four different heights are shown in the interconnect structure 530, of course more or fewer different heights may be implemented in the interconnect structure 530.

The size variation used in the interconnect structure 530 may be determined by knowing an expected bending resulting from the semiconductor assembly process or through knowledge obtained a priori to the design about bending in a semiconductor assembly process. For example, if the bend is known to be 40 µm for a semiconductor assembly process, the interconnect structure components may vary by 40 µm to induce a reverse bend of approximately equal magnitude.

Height of the interconnect structure components may also depend on configuration of the die 540. For example, the die 540 may have a fully populated interconnect structure 530. Alternatively, the die 540 may have a partially populated interconnect structure 530 located at the center of the die 540 and the periphery of the die 540. In the case of a partially populated interconnect structure 530 a center area may be a first height and the periphery a second height. For example, if warpage of the die 540 is 10 µm after assembly, the center area may be 10 µm offset or different in height than the periphery.

The interconnect structure 530 may be manufactured with multiple size components using, for example, variable materials, different mask sets, different processes such as temperatures, and/or different plating rates. For example, in the case the interconnect structure 530 is deposited using electroplating, the plating process may be altered so that lower current densities exist at the center of the die 540 during deposition of the interconnect structure 530. As a result, the plating rate for metals in a center of the die 540 are lower resulting in a lower height. Alternatively, different heights may be accomplished by varying thickness of a photoresist on the die 540 before deposition of the interconnect structure 530. In locations where photoresist is thicker, the interconnect structure components will be taller; in locations where photoresist is thinner, the interconnect structure components will be shorter. In another embodiment, a different temperature is used to reflow interconnect structure components at the center of the die, resulting in the interconnect structure components having a variable height after reflow.

In another case, the interconnect structure 530 may be pillars (of similar heights prior to reflow) and manufactured from different materials. For example, copper pillars may be used for outside connectors and tin-silver (SnAg) alloy pillars may be used for inside connectors. The copper pillars are more rigid and experience a smaller change during compression than the tin-silver alloy pillars. As a result, the copper pillars are taller than the SnAg pillars after reflow.

In yet another case, the interconnect structure 530 may be different types of connections. For example, the interconnect structure components may be pillars at the inside of the die 540 whereas the interconnect structure components may be bumps at the outside of the die 540.

After reflow, induced reverse bending on the die 540 and bending on the die 540 resulting from semiconductor assembly are balanced as discussed below in FIG. 6.

Figure 6:
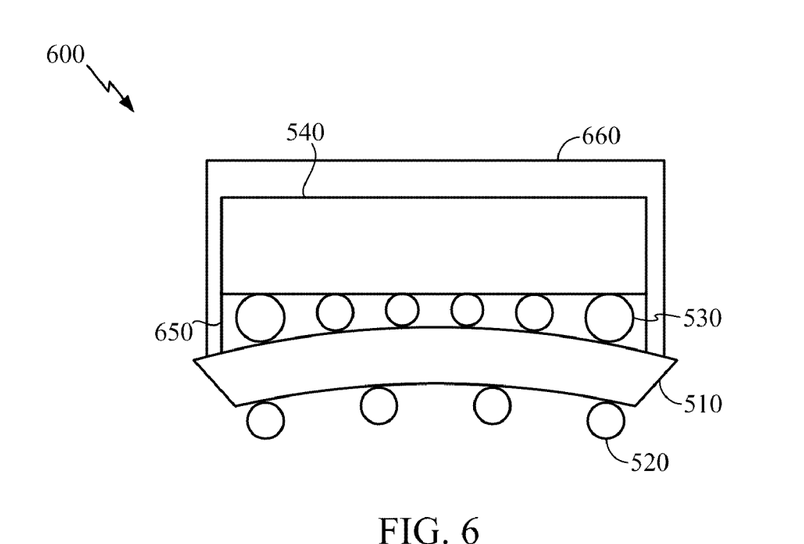
FIG. 6 is a block diagram illustrating an exemplary packaged die having induced reverse bending after reflow according to the first embodiment.

FIG. 6 is a block diagram illustrating an exemplary packaged die having induced reverse bending after reflow according to the first embodiment. After reflow, the interconnect structure 530 is encapsulated in an underfill 650, and a packaged die 600 is encapsulated in a molding compound 660. Semiconductor assembly alters the balance of bending in the packaged die 600. For example, during a reflow process, the packaged die 600 is exposed to several cycles of heating and cooling. As a result, the packaging substrate 510 warps along its long axis as shown in the packaged die 600.

Variable height of the interconnect structure 530, according to one embodiment, reduces bending in the packaged die 600 after assembly by inducing an approximately equal and opposite bend on the die 540. The die 540 is substantially flat as a result of cancellation of bending during semiconductor assembly and an induced reverse bend imposed by the interconnect structure 530. Although the induced bend is shown in FIG. 5 and FIG. 6 to bend edges of a die away from a packaging substrate, the same concept may be used to balance bending of an opposite direction. For example, if a semiconductor manufacturing process results in a packaging substrate bending up at the packaging substrate's edges, the variable height of a packaging connection between a die and the packaging substrate may be adapted to vary height so the larger balls are in the center of the die.

Figure 7:
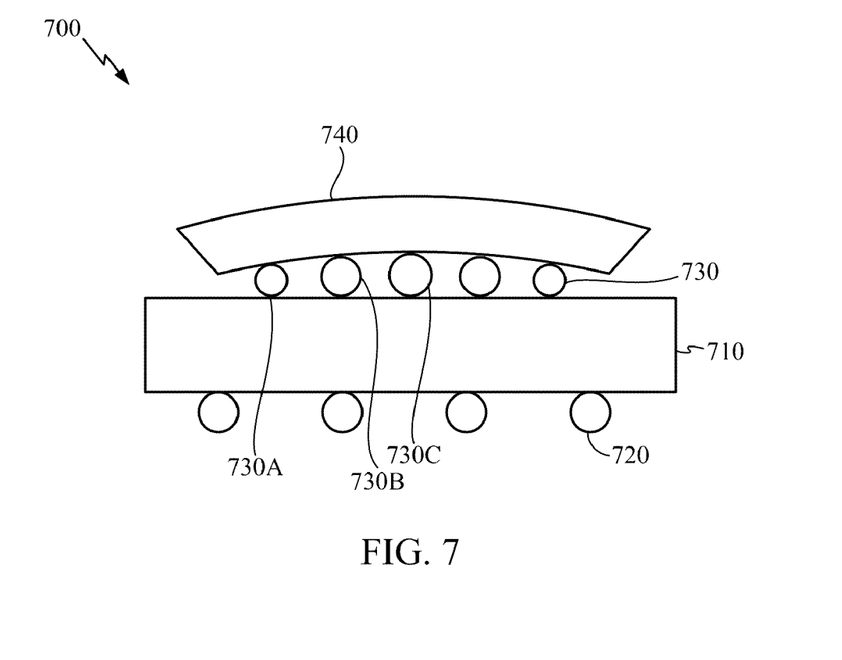
FIG. 7 is a block diagram illustrating an exemplary packaged die having induced reverse bending according to a second embodiment.

Another example of balancing bending in a semiconductor die by inducing a reverse bending is now explained with reference to FIG. 7 and FIG. 8. FIG. 7 is a block diagram illustrating an exemplary packaged die having induced reverse bending according to a second embodiment. A packaged die 700 includes a packaging substrate 710 having a packaging connection 720. Coupled to the packaging substrate 710 is a die 740. The die 740 is coupled to the packaging substrate 710 through an interconnect structure 730. The interconnect structure 730 may be bumps of a ball grid array or solder pillars, for example.

A reverse bend may be induced through the interconnect structure 730 by varying a height of the interconnect structure 730 corresponding to location relative to the die 740. For example, if the interconnect structure 730 is bumps of a ball grid array, the height of each bump is varied. A bump 730A at the periphery of the die 740 is smaller than a bump 730B closer to the center of the die 740. The size increase continues for a bump 730C, which is closer to the center of the die 740 than the bump 730B.

When the die 740 is pressed against the packaging substrate 710 the die 740 bends to couple the interconnect structure 730 to the packaging substrate 710. Alternatively, during ball reflow the die 740 may be pulled to the packaging substrate 710. Bending of the die 740 in one embodiment is designed to induce inverse bending to counter bending caused by a heating and cooling process such as reflow.

The interconnect structure components (e.g., pillars or bumps) may be manufactured having multiple sizes using, for example, variable materials, different mask sets, and/or different plating rates. For example, in the case the interconnect structure 730 is deposited using electroplating, the plating process may be altered so that lower current densities exist at the center of the die 740 during deposition of the interconnect structure 730. As a result, the plating rate for metals in a center of the die 740 are lower resulting in a lower height.

After reflow, induced reverse bending of the die 740 and bending of the die 740 resulting from semiconductor assembly, including bending of the packaging substrate 710 are balanced as discussed below with reference to FIG. 8.

Figure 8:
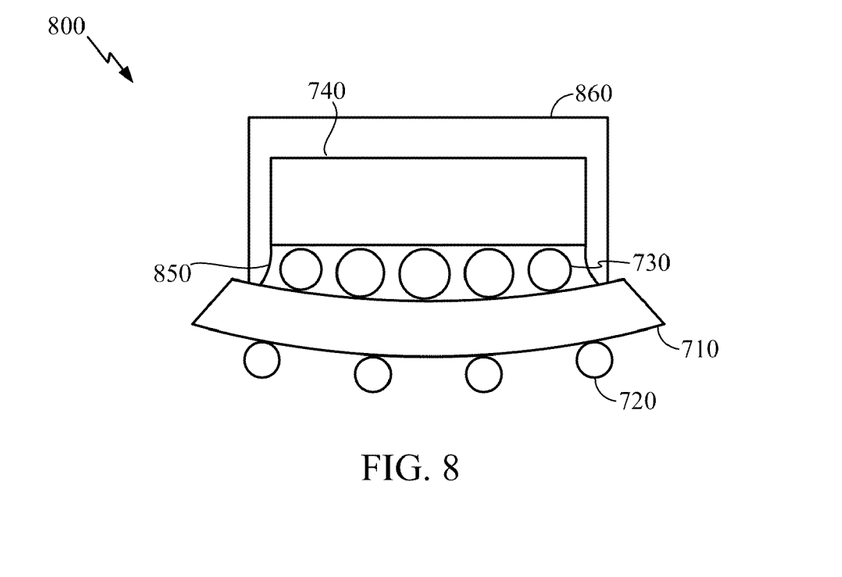
FIG. 8 is a block diagram illustrating an exemplary packaged die having induced reverse bending after reflow according to the second embodiment.

FIG. 8 is a block diagram illustrating an exemplary packaged die having induced reverse bending after reflow according to the second embodiment. After reflow the interconnect structure 730 is encapsulated in an underfill 850, and a packaged die 800 is encapsulated in a molding compound 860. Semiconductor assembly alters the balance of bending in the packaged die 800. For example, during a reflow process, the packaged die 800 is exposed to several cycles of heating and cooling. As a result, the packaging substrate 710 bends along its long axis as shown in the packaged die 800. Variable height of the interconnect structure 730, according to one embodiment, balances bending by inducing an approximately equal and opposite bending of the die 740. The die 740 experiences a balanced bending as a result of an induced reverse bend imposed by the interconnect structure 730.

Induced bending has been described above to balance bending in semiconductor dies, but induced bending may be used in other semiconductor components to create a net balanced bend. For example, in a package-on-package system, each package may have different thermal coefficients of expansion resulting in bending of the packages. An induced bending may be applied on the package-on-package to prevent bending a package in the system, as described below with reference to FIG. 9.

Figure 9:
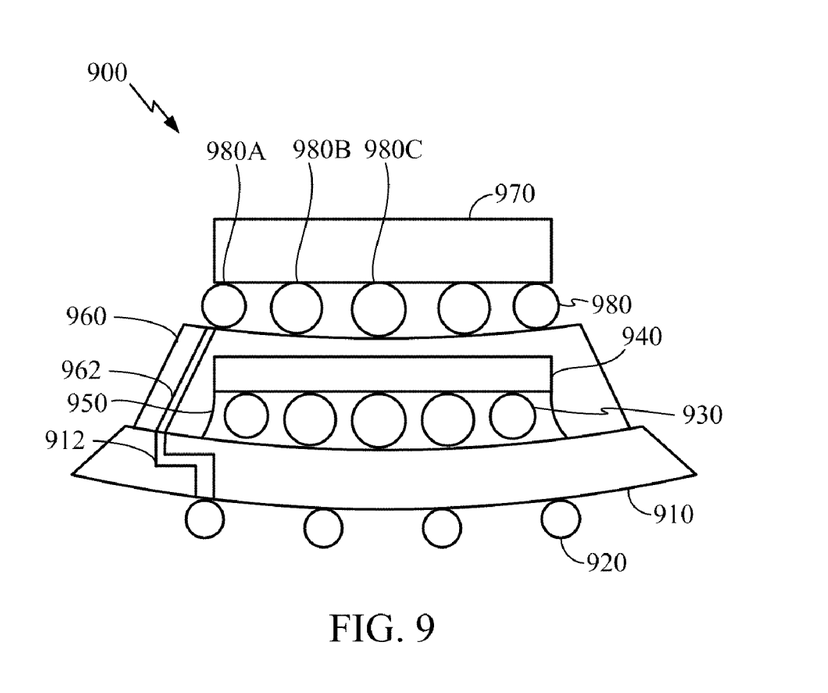
FIG. 9 is a block diagram illustrating an exemplary package-on-package system having induced reverse bending according to a third embodiment.

FIG. 9 is a block diagram illustrating an exemplary package-on-package system having induced reverse bending according to one embodiment. A package-on-package system 900 includes a first packaging substrate 910 having a packaging connection 920. A die 940 is coupled to the first packaging substrate 910 through an interconnect structure 930. The interconnect structure 930 may be bumps of a ball grid array (and/or solder pillars) and have variable height to induce a balanced bending of the die 940 as described above. An underfill 950 encapsulates the interconnect structure 930. A molding compound 960 encapsulates the die 940.

In one embodiment, the first packaging substrate 910 is stiff to reduce warpage. The reduced warpage decreases the profile of the interconnect structure 930 and the die 940 and consequently the overall height.

After the molding compound 960 is deposited, a second packaging substrate 970 may be mounted above the first packaging substrate 910 with a packaging connection 980. The top surface of the molding compound 960 may be warped due to heat cycles, difference between coefficients of thermal expansion of different materials, and elastic and inelastic deformations of materials during assembly process. Thus, warpage of the molding compound 960 occurs post-assembly.

Variable height connectors in the packaging connection 980 are used to induce a balancing bend on the second packaging substrate 970. The variable height of the packaging connection 980 provides a level surface for the second packaging substrate 970 after the molding compound 960 warps. For example, when the first packaging substrate 910 (as well as the other elements of the first package, including the molding compound 960) bends up at the periphery, height of the packaging connection 980 will vary from small at the periphery of the second packaging substrate 970 to large at the center of the second packaging substrate 970.

The packaging connection 980 may be bumps of a ball grid. In this case a bump 980A away from the center of the second packaging substrate 970 is smaller than a bump 980B, and the bump 980B is smaller than a bump 980C towards the center of the second packaging substrate 970.

Through mold vias 962 are etched in the mold compound 960 for coupling the second packaging substrate 970 to electrical paths 912 in the first packaging substrate 910. The through mold vias 962 may be etched using laser etching. Communication with the second packaging substrate 970 from external circuitry (not shown) is through the packaging connection 920, the electrical paths 912, the through mold via 962 and the packaging connection 980.

Figure 10:
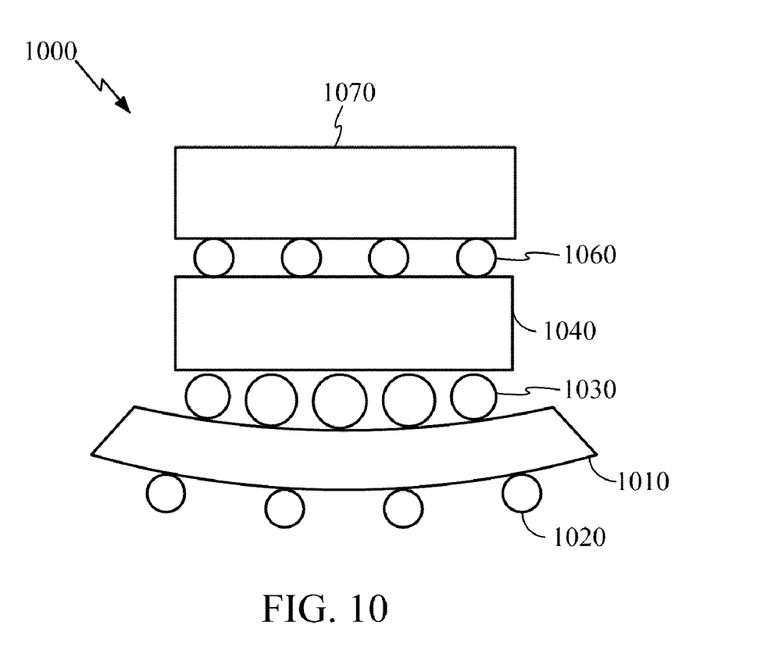
FIG. 10 is a block diagram illustrating an exemplary stacked die having induced reverse bending according to a fourth embodiment.

In a fourth embodiment, reverse bending may be induced in a stacked die system. FIG. 10 is a block diagram illustrating an exemplary stacked die having induced reverse bending according to a fourth embodiment. A stacked die 1000 includes a packaging substrate 1010 having an packaging connection 1020. The packaging substrate 1010 may experience bending, for example, as a result of assembly processes. For example, heat during a reflow process may bend the packaging substrate 1010.

A first tier die 1040 is coupled to the packaging substrate 1010 through an interconnect structure 1030 such as bumps or pillars. The interconnect structure 1030 has variable features that induce a reverse bend on the first tier die 1040 that cancels a bend resulting from the packaging substrate 1010 or an inherent bend in the first tier die 1040. The reverse bend results in the first tier die 1040 having balanced bending.

A second tier die 1070 may be coupled to the first tier die 1040 through an interconnect structure 1060 such as bumps or pillars. The second tier die 1070 may communicate with the packaging substrate 1010 or circuitry on the first tier die 1040 with through silicon vias (not shown) in the first tier die 1040. The interconnect structure 1060 does not induce a reverse bend on the second tier die 1070, since the reverse bend on the first tier die 1040 results in a nearly flat surface for stacking of the second tier die 1070. Although two tiers are shown in the stacked die 1000, of course there may be many more dies stacked above, such as a third tier, fourth tier, et cetera.

Allowing a balancing bend in a component of a semiconductor die mitigates warpage of thin dies. According to one embodiment, the balancing bend may be allowed through a variable height packaging connection such as variable height bumps. In another embodiment, different packaging connection materials allow the balancing bend. Mitigating warpage of thin dies is important to maintain correct component functionality and prevent structural damage resulting from high residual bends. Variable height packaging connections may be applied in other systems such as package-on-package systems. For example, a variable height packaging connection of a second package stacked on a first package mitigates warpage of the second package.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor die, comprising an interconnect structure with at least one variable feature inducing an inverse bend on the semiconductor die.

2. The semiconductor die of claim 1, in which the inverse bend counteracts bending during semiconductor assembly.

3. The semiconductor die of claim 2, in which the interconnect structure comprises bumps.

4. The semiconductor die of claim 2, in which the interconnect structure comprises pillars.

5. The semiconductor die of claim 2, in which the at least one variable feature is a height of the interconnect structure.

6. The semiconductor die of claim 5, in which the interconnect structure has a first height at a periphery of the semiconductor die and a second height at a center of the semiconductor die, the first height differing from the second height.

7. The semiconductor die of claim 2, in which the at least one variable feature is a material composition of the interconnect structure.

8. The semiconductor die of claim 7, in which a portion of the interconnect structure is a tin-silver alloy and a portion of the interconnect structure is copper.

9. The semiconductor die of claim 2, in which the semiconductor die is integrated into a communications device.

10. A semiconductor die comprising:
an interconnect structure with at least one variable feature inducing an inverse bend on the semiconductor die, the inverse bend counteracting bending during semiconductor assembly; and
a second packaging substrate coupled to the first packaging substrate through a second interconnect structure comprising elements of variable features that induces opposite bending on the second packaging substrate to mitigate warpage after semiconductor assembly.

11. A method of semiconductor assembly, the method comprising:
providing on a semiconductor die an interconnect structure with at least one variable feature that induces a reverse bend on the semiconductor die during the semiconductor assembly; and
coupling the semiconductor die to a packaging substrate through the interconnect structure.

12. The method of claim 11, in which the reverse bend mitigates warpage during the semiconductor assembly.

13. The method of claim 12, further comprising applying a temperature to reflow the interconnect structure that causes the packaging substrate to bend an amount approximately equal to the reverse bend on the semiconductor die.

14. A method of semiconductor assembly, the method comprising:
providing on a semiconductor die an interconnect structure at least one variable feature that induces a reverse bend on the semiconductor die during the semiconductor assembly;
coupling the semiconductor die to a packaging substrate through the interconnect structure; and
applying a temperature to reflow the interconnect structure that causes the packaging substrate to bend an amount approximately equal to the reverse bend on the semiconductor die, in which applying the temperature further comprises applying a first temperature at a center of the interface structure and applying a second temperature at a periphery of the interface structure.

15. The method of claim 12, in which providing the interconnect structure on the semiconductor die comprises depositing interconnect structure components of varying materials.

16. The method of claim 15, in which providing the interconnect structure of varying material comprises:
depositing interconnect structure components of tin-silver alloy at a first location of the semiconductor die; and
depositing interconnect structure components of copper at a second location, different from the first location, of the semiconductor die.

17. The method of claim 12, further comprising integrating the semiconductor die into a communications device.

18. A semiconductor system, comprising:
a packaging substrate,
a semiconductor die coupled to the packaging substrate through means for communicating with the packaging substrate having elements of at least one variable feature that induces a reverse bend on the semiconductor die to mitigate warpage of the semiconductor die during semiconductor assembly.

19. The semiconductor system of claim 18, in which the at least one variable feature comprises variable heights.

20. The semiconductor system of claim 18, in which the at least one variable feature comprises variable material compositions.

* * * * *